(«12») United States Patent
Ogawa et al.

(10) Patent No.: US 9,793,561 B2
(45) Date of Patent: Oct. 17, 2017

(54) FUEL CELL SYSTEM AND CONTROL METHOD OF FUEL CELL SYSTEM

(71) Applicant: TOYOTA JIDOSHA KABUSHIKI KAISHA, Toyota-shi, Aichi-ken (JP)

(72) Inventors: Tomohiro Ogawa, Miyoshi (JP); Yoshiaki Naganuma, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/932,110

(22) Filed: Nov. 4, 2015

(65) Prior Publication Data
US 2016/0141676 A1 May 19, 2016

(30) Foreign Application Priority Data

Nov. 13, 2014 (JP) ................. 2014-230864

(51) Int. Cl.
*H01M 8/04858* (2016.01)
*H01M 8/04537* (2016.01)
*H01M 8/04992* (2016.01)
*H01M 8/04746* (2016.01)
*H01M 8/0432* (2016.01)
*G01R 31/36* (2006.01)
*H01M 8/1018* (2016.01)

(52) U.S. Cl.
CPC ... *H01M 8/04641* (2013.01); *H01M 8/04365* (2013.01); *H01M 8/04753* (2013.01); *H01M 8/04992* (2013.01); *G01R 31/3662* (2013.01); *H01M 2008/1095* (2013.01); *H01M 2250/20* (2013.01); *Y02T 90/32* (2013.01)

(58) Field of Classification Search
CPC ........................ H01M 8/04649; H01M 8/0488
See application file for complete search history.

(56) References Cited

U.S. PATENT DOCUMENTS

2010/0261082 A1 10/2010 Kajiwara et al.
2010/0323260 A1* 12/2010 Imamura ........... H01M 8/04253
429/430

FOREIGN PATENT DOCUMENTS

| JP | 2006-324066 A | 11/2006 |
| JP | 2013-110019 | 6/2013 |
| JP | 2014-207049 A | 10/2014 |
| KR | 10-2009-008229 1 | 7/2009 |
| WO | WO 2013/076556 A1 | 5/2013 |

* cited by examiner

Primary Examiner — Olatunji Godo
(74) Attorney, Agent, or Firm — Finnegan, Henderson, Farabow, Garrett & Dunner, LLP

(57) ABSTRACT

An object is to provide a technique that a current state of a fuel cell may be detected more accurately. A fuel cell system includes a controller, a fuel cell, and an impedance measurer that may measure an impedance of the fuel cell. The controller obtains a first impedance value that expresses the impedance of the fuel cell in a predetermined state, acquires a second impedance value that expresses the impedance of the fuel cell that is measured by the impedance measurer during operation control of the fuel cell, and performs operation control of the fuel cell using the first impedance value and the second impedance value.

20 Claims, 8 Drawing Sheets

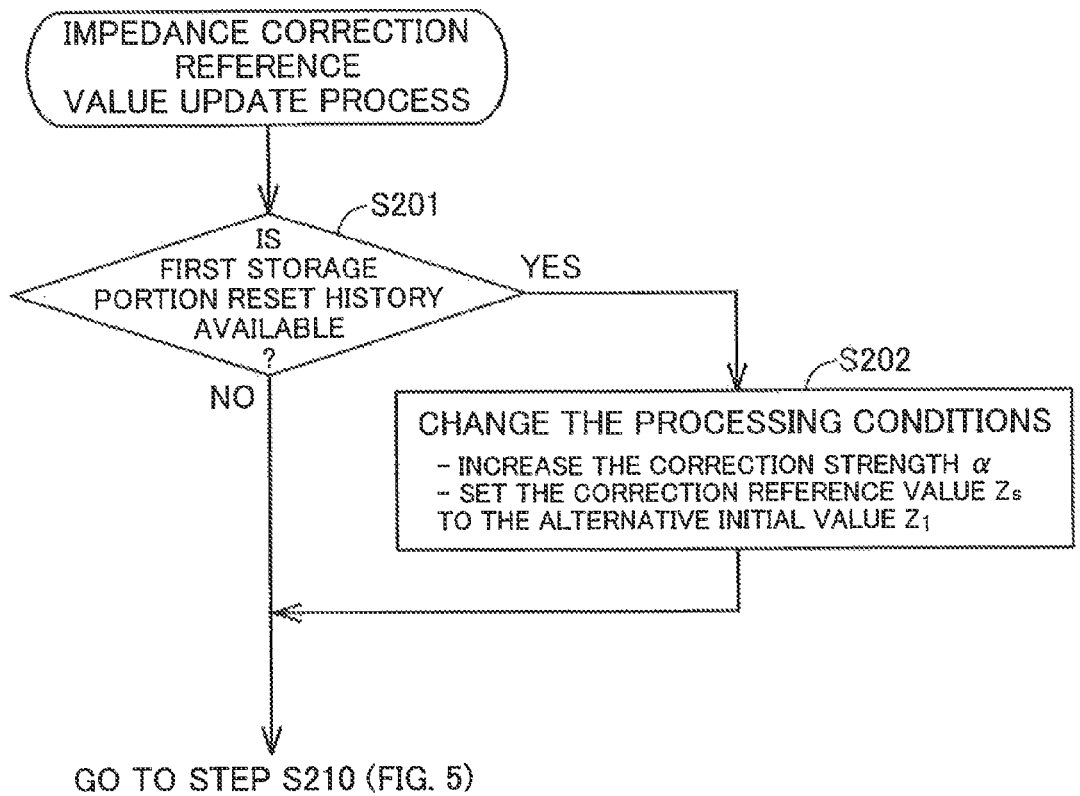
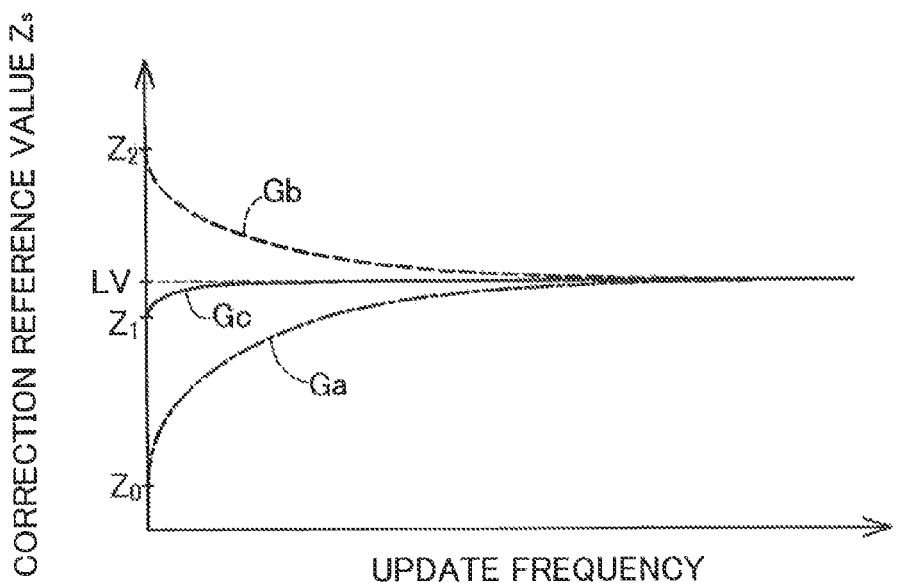

FUEL CELL SYSTEM AND CONTROL METHOD OF FUEL CELL SYSTEM

CROSS-REFERENCE TO RELATED APPLICATIONS

The present application claims the priority based on the Japanese Patent Application No. (JP) 2014-230864 filed on Nov. 13, 2014, the disclosure of which is incorporated by reference herein in its entirety.

BACKGROUND

Field

The present invention relates to a fuel cell system and a control method of a fuel cell system.

Related Art

A polymer electrolyte fuel cell (hereinafter, simply called a "fuel cell") has a thin film of a solid polymer that shows excellent proton conductivity in a wet state, and the moisture status inside the fuel cell affects the power generation efficiency. In a fuel cell system, in some cases, the impedance that expresses the internal resistance of the fuel cell is measured to detect the change in the moisture status inside the fuel cell (for example, JP2013-110019A).

It is known that the internal resistance of a fuel cell also changes due to aging degradation of the fuel cell. Therefore, when a fuel cell undergoes aging degradation, the correlation between the impedance of the fuel cell and the moisture status inside the fuel cell changes, which may make it impossible to accurately detect the moisture status of the fuel cell. From the past, in order to apply to the operation control for the fuel cell, a technology that may detect not only the moisture status inside the fuel, but, also accurately detect the current status of the fuel cell is desired.

SUMMARY

In order to solve at least part of the problem described above, the present invention may be implemented in the aspects described below.

(1) According to a first aspect of the present invention, a fuel cell system is provided. The fuel cell system may include a fuel cell, an impedance measurer, and a controller. The impedance measurer may measure the impedance of the fuel cell. The controller may perform an operation control of the fuel cell. The controller may obtain a first impedance value that expresses the impedance of the fuel cell in a predetermined state, and may acquire a second impedance value that expresses the impedance of the fuel cell measured by the impedance measurer during the operation control of the fuel cell, and may perform the operation control of the fuel cell using the first impedance value and the second impedance value. According to the fuel cell system of this aspect, the state of the fuel cell that includes, for example the wet state inside the fuel cell may be detected accurately by using the first impedance value and the second impedance value, and more appropriate operation control in accordance with the state of the fuel cell may be performed.

(2) In the fuel cell system of above aspect, the controller may correct the second impedance value using the first impedance value, and performs the operation control of the fuel cell on the basis of the second impedance value after correction. According to the fuel cell system of this aspect, since the second impedance value is adjusted on the basis of the first impedance value, the state of the fuel cell may be detected more accurately.

(3) The fuel cell system of the above aspect may further include a storage portion for storing the first impedance value, and the controller may execute an update process that updates the first impedance value stored in the storage portion when the fuel cell reaches the predetermined state during the operation control of the fuel cell, in the update process, the controller may read the first impedance value from the storage portion as an original value, obtain the impedance of the fuel cell as a present value by the impedance acquisition portion, calculate an updated first impedance value by using the original value and the present value, and store the updated first impedance value in the storage portion as the first impedance value. According to the fuel cell system of this aspect, since the first impedance value may be sequentially updated, the value of the first impedance value is adjusted in a better way. Therefore, the accuracy of detection of the state of the fuel cell on the basis of impedance may be further improved.

(4) In the fuel cell system of the above aspect may further include a temperature detect portion that detects an operating temperature of the fuel cell, and the controller may determine that the fuel cell reaches the predetermined state when the operating temperature of the fuel cell is within a predetermined temperature range, and executes the update process. According to the fuel cell system of this aspect, when the fuel cell is in a temperature state that is suitable for measuring the impedance, the present value for updating the first impedance value may be acquired, and thus, the reliability of the value of the first impedance value may be improved.

(5) In the fuel cell system of the above aspect, the controller may determine that the fuel cell reaches the predetermined state when the operating temperature of the fuel cell is within the predetermined temperature range during a predetermined time period, and executes the update process. According to the fuel cell system of this aspect, the fuel cell may acquire the present value when the temperature status suitable for the measurement of the impedance is continued, and thus, the acquisition of the present value immediately after the state in which the fuel cell is in a remarkably high temperature may be prevented, and a decline in the reliability of the value of the first impedance value may also be prevented.

(6) In the fuel cell system of the above aspect, the controller may update the first impedance value with reflecting a difference between the present value and the original value so that a difference between the present value and the updated first impedance value is reduced. According to the fuel cell system of this aspect, the value of the first impedance value is more optimized.

(7) In the fuel cell system of the above aspect, the controller may update the first impedance value by using a correction strength that express a extent of reflection of the difference between the present value and the original value in the update process. According to the fuel cell system of this aspect, the learning speed for adjustment of the first impedance value may be controlled by changing the correction strength.

(8) The fuel cell system of the above aspect may further include an initialization detector for detecting a history of initialization of the storage portion, and the controller may change the correction strength so that the extent of reflection of the difference between the present value and the original value becomes large when the history of initialization of the storage portion is detected by the initialization detector. According to the fuel cell system of this aspect, the learning speed of the first impedance value after the initialization of the storage contents of the storage portion may be improved, and the time period until the recovery of the first impedance value to a value close to the value before initialization of the storage portion is reduced.

(9) In the fuel cell system of the above aspect, the storage portion is a first storage portion, and the fuel cell system of the above aspect may further comprise a second storage portion for storing an initial value of the first impedance value; and an initialization detector for detecting a history of initialization of the first storage portion, and the controller may set a value that is larger than the initial value of the first impedance value stored in the second storage portion as the original value, and restart the update of the first impedance value in the update process, when a history of initialization of the first storage portion is detected by the initialization detector. According to the fuel cell system of this aspect, the time period until the recovery of the first impedance value to a value close to the value before initialization of the first storage portion is reduced.

(10) The fuel cell system of the above aspect may further include a reaction gas supply portion for supplying reaction gas to the fuel cell, and the controller may control the reaction gas supply portion in the operation control of the fuel cell using the first impedance value and the second impedance value. According to the fuel cell system of this aspect, the supply of the reaction gas to the fuel cell is performed more appropriately depending on the current impedance of the fuel cell.

Not all of the plurality of components of each of the above-described forms of the present invention are necessary, and in order to resolve some or all of the above-described issues, or to realize some or all of the above-described effects, some of the plurality of components may be appropriately changed, deleted, substituted with other new components, or some of the restricted contents may be deleted. Moreover, in order to resolve some or all of the above-described issues, or to realize some or all of the above-described effects, some or all of the technical characteristics described in one of the embodiments of the present invention may be combined with some or all of the technical characteristics included in the above-described other forms of the present invention to result in an independent form of the present invention.

The present invention may also be implemented through various forms other than a fuel cell system. For example, the present invention may be implemented through forms, such as an apparatus for measurement of impedance of a fuel cell and a measurement method; a correction method; a method of controlling a fuel cell system; a computer program for implementing such methods; or a non-transitory recording medium in which such a computer program is recorded.

BRIEF DESCRIPTION OF THE DRAWINGS

FIG. 8 is an explanatory diagram showing a flow of an impedance correction reference value update process according to the second embodiment; and FIG. 9 is an explanatory diagram showing an effect when a correction reference value is set in an alternate initial value in place of an initial value;

DESCRIPTION OF THE EMBODIMENTS

A. First Embodiment

A1. Configuration of a Fuel Cell System

Figure 1:
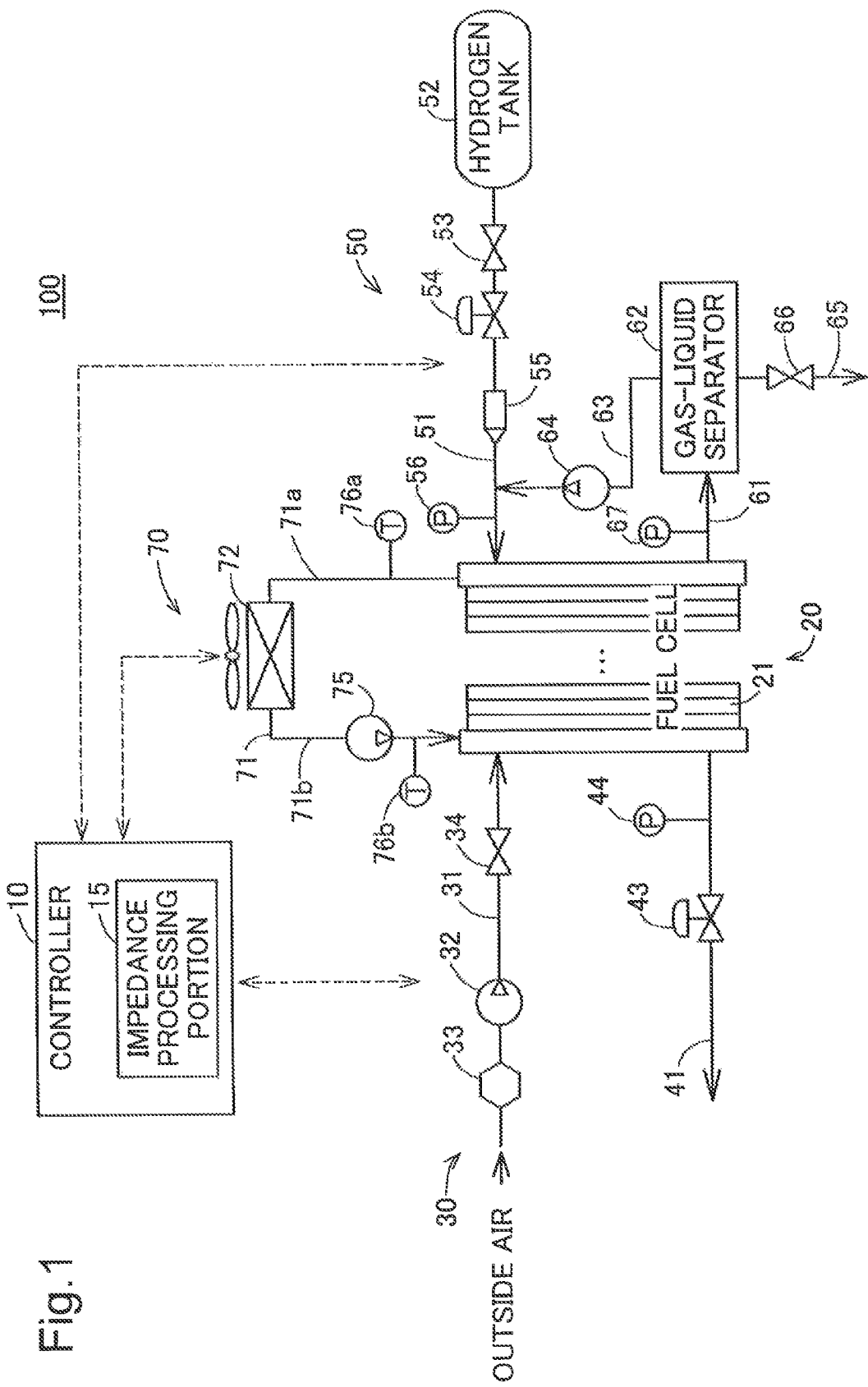
FIG. 1 is a schematic diagram showing a configuration of a fuel cell system according to a first embodiment.

FIG. 1 is a schematic diagram showing a configuration of a fuel cell system 100 according to a first embodiment of the present invention. The fuel cell system 100 is mounted on a fuel cell vehicle, and outputs the power to be used as driving power in accordance with a request from a driver that is a user. The fuel cell system 10 includes a controller 10, a fuel cell 20, a cathode gas supply portion 30, an anode gas supply portion 50, and a cooling medium supply portion 70.

The controller 10 is configured by a micro-computer having a central processing unit and a main storage unit, and the controller 10 exerts various functions by reading and executing programs on the main storage unit. The controller 10 has a function of executing operation control of the fuel cell 20 that generates power according to a request output to the fuel cell 20 by controlling each configuring portion of the fuel cell system 100. The controller 10 further has a function of an impedance processing portion 15 that acquires and corrects the impedance of the fuel cell 20 used in operation control of the fuel cell 20. The operation control of the fuel cell 20 by the controller 10 and the functioning of the controller 10 as the impedance processing portion 15 are described later.

The fuel cell 20 is a polymer electrolyte fuel cell that generates power by receiving a supply of hydrogen (anode gas) and air (cathode gas) as the reaction gas. The fuel cell 20 has a stacked structure in which a plurality of unit cells 21 are stacked. Each unit cell 21 is a power-generating element that may generate power individually as well, and includes a membrane electrode assembly that is a power generator in which electrodes are arranged on both surfaces of an electrolyte film, and two separators (not shown in the figure) that sandwich the membrane electrode assembly. The electrolyte film is configured by a solid polymer thin film showing excellent proton conductivity in the wet state when moisture is contained inside the fuel cell. The electrodes of the membrane electrode assembly include a catalyst layer and a gas diffusion layer.

The cathode gas supply portion 30 has a function of supplying cathode gas to the fuel cell 20, and a function of discharging the discharge water that is discharged from the cathode side of the fuel cell 20 and the cathode exhaust gas to outside the fuel cell system 100. The cathode gas supply portion 30 includes a cathode gas pipe 31, an air compressor 32, an air flowmeter 33, and an on-off valve 34 at the upstream side of the fuel cell 20. The cathode gas pipe 31 is a pipe that is connected to the inlet at the cathode side of the fuel cell 20. The air compressor 32 is connected to the fuel cell 20 via the cathode gas pipe 31, and supplies the air that is compressed by incorporating the outside air to the fuel cell 20 as the cathode gas.

The air flowmeter 33 measures the amount of outside air incorporated by the air compressor 32 at the upstream side of the air compressor 32, and sends the measured value to the controller 10. By driving the air compressor 32 on the basis of the measured value, the controller 10 controls the amount of supply of air to the fuel cell 20. The on-off valve 34 is provided between the air compressor 32 and the fuel cell 20. The on-off valve 34 is normally in a closed state, and opens when air having a predetermined pressure is supplied to the cathode gas pipe 31 from the air compressor 32.

The cathode gas supply portion 30 includes a cathode exhaust gas pipe 41, a pressure-regulating valve 43, and a pressure measurement portion 44 at the downstream side of the fuel cell 20. The cathode exhaust gas pipe 41 is a pipe that is connected to the outlet at the cathode side of the fuel cell 20, and discharges the discharge water and cathode exhaust gas to the outside of the fuel cell system 100. The pressure-regulating valve 43 adjusts the pressure of the cathode exhaust gas (back pressure at the cathode-side of the fuel cell 20) in the cathode exhaust gas pipe 41. The pressure measurement portion 44 is provided at the upstream-side of the pressure-regulating valve, measures the pressure of the cathode exhaust gas, and sends the measured value to the controller 10. The controller 10 adjusts the opening of the pressure-regulating valve 43 on the basis of the measured value of the pressure measurement portion 44.

The anode gas supply portion 50 has a function of supplying anode gas to the fuel cell 20, a function of discharging the anode exhaust gas that is discharged from the fuel cell 20 to the outside of the fuel cell system 100, and a function of circulating the anode gas within the fuel cell system 100. The anode gas supply portion 50 includes an anode gas pipe 51, a hydrogen tank 52, an on-off valve 53, a regulator 54, a hydrogen supply apparatus 55, and a pressure measurement portion 56 at the upstream side of the fuel cell 20. High-pressure hydrogen is filled in the hydrogen tank 52 for supply to the fuel cell 20. The hydrogen tank 52 is connected to the inlet at the anode side of the fuel cell 20 via the anode gas pipe 51.

The on-off valve 53, the regulator 54, the hydrogen supply apparatus 55, and the pressure measurement portion 56 are provided, in this order, to the anode gas pipe 51 from the upstream side (the hydrogen tank 52-side). By controlling the opening and closing of the on-off valve 53, the controller controls the inflow of hydrogen from the hydrogen tank 52 to the upstream side of the hydrogen supply apparatus 55. The regulator 54 is a pressure-reducing valve for adjusting the pressure of hydrogen at the upstream side of the hydrogen supply apparatus 55, and the opening thereof is controlled by the controller 10. The hydrogen supply apparatus 55, for example, is configured by an injector, which is a solenoid operated on-off valve. The pressure measurement portion 56 measures the pressure of hydrogen at the downstream side of the hydrogen supply apparatus 55, and sends the measured value to the controller 10. By controlling the drive cycle (opening/closing cycle) of the hydrogen supply apparatus 55 on the basis of the measured value of the pressure measurement portion 56, the amount of hydrogen supplied to the fuel cell 20 is controlled.

The anode gas supply portion 50 includes an anode discharge pipe 61, a gas-liquid separator 62, an anode gas circulation pipe 63, a hydrogen circulation pump 64, an anode discharge water pipe 65, a drain valve 66, and a pressure measurement portion 67 at the downstream side of the fuel cell 20. The anode exhaust gas pipe 61 connects the anode-side outlet of the fuel cell 20 and the gas-liquid separator 62. The anode exhaust gas pipe 61 is provided with a pressure measurement portion 67. The pressure measurement portion 67 measures the pressure of the anode exhaust gas in the vicinity of fuel cell 20 hydrogen manifold outlet (anode-side back pressure of fuel cell 20), and sends the measurement to the controller 10.

The gas-liquid separator 62 is connected to the anode gas circulation pipe 63 and the anode discharge water pipe 65. The anode exhaust gas that flows into the gas-liquid separator 62 through the anode exhaust gas pipe 61 is separated into the gas component and the water component by the gas-liquid separator 62. In the gas-liquid separator 62, the gas component of the anode exhaust gas is channeled into the anode gas circulation pipe 63, and the water component is channeled into the anode discharge water pipe 65.

The anode gas circulation pipe 63 is connected downstream from the hydrogen supply apparatus 55 of the anode gas pipe 51. The hydrogen circulation pump 64 is provided in the anode gas circulation pipe 63, and the hydrogen included in the gas component separated in the gas-liquid separator 62 is fed to the anode gas pipe 51 by the hydrogen circulation pump 64.

The drain valve 66 is provided in the anode discharge water pipe 65. The drain valve 66 opens and closes according to an instruction from the controller 10. The controller 10 normally keeps the drain valve 66 in the closed position, and opens the drain 66 at a predetermined discharge water timing that has already been set, or at the discharge timing of the inert gas present in the anode exhaust gas. The downstream end of the anode drain pipe 65 mixes the anode-side waste water and the anode exhaust gas with the cathode-side waste water and the cathode exhaust gas and merges them into the cathode exhaust gas pipe 41 so that they may be discharged (not shown in the drawing).

The cooling medium supply portion 70 includes a cooling medium pipe 71, a radiator 72, a circulation pump 75, and two temperature measurement portions 76a and 76b. The cooling medium pipe 71 is a pipe for circulating the cooling medium for cooling the fuel cell 20, and is configured by an upstream-side pipe 71a and a downstream-side pipe 71b. The upstream-side pipe 71a connects the outlet of the cooling medium flow path inside the fuel cell 20 and the inlet of the radiator 72. The downstream-side pipe 71b connects the inlet of the cooling medium flow path inside the fuel cell 20 and the outlet of the radiator 72.

The radiator 72 has a fan for pulling in outside air, which cools the cooling medium through heat exchange between the cooling medium pipe 71 and the outside air. The circulation pump 75 is provided in the downstream-side pipe 71b, and is driven on the basis of an instruction from the controller 10. The cooling medium flows inside the cooling medium pipe 71 because of the driving power of the circulation pump 75.

The first temperature measurement portion 76a is provided in the upstream-side pipe 71a, and the second temperature measurement portion 76b is provided in the downstream-side pipe 71b. The controller 10 detects the cooling medium temperature in each pipe 71a and 71b by the two temperature measurement portions 76a and 76b, and detects the temperature of the fuel cell 20 from the difference in the cooling medium temperature of each pipe 71a and 71b. The controller 10 controls the operating temperature of the fuel cell 20 by changing the rotation speed of the circulation pump 75 based on the operating temperature of the fuel cell 20.

Figure 2:
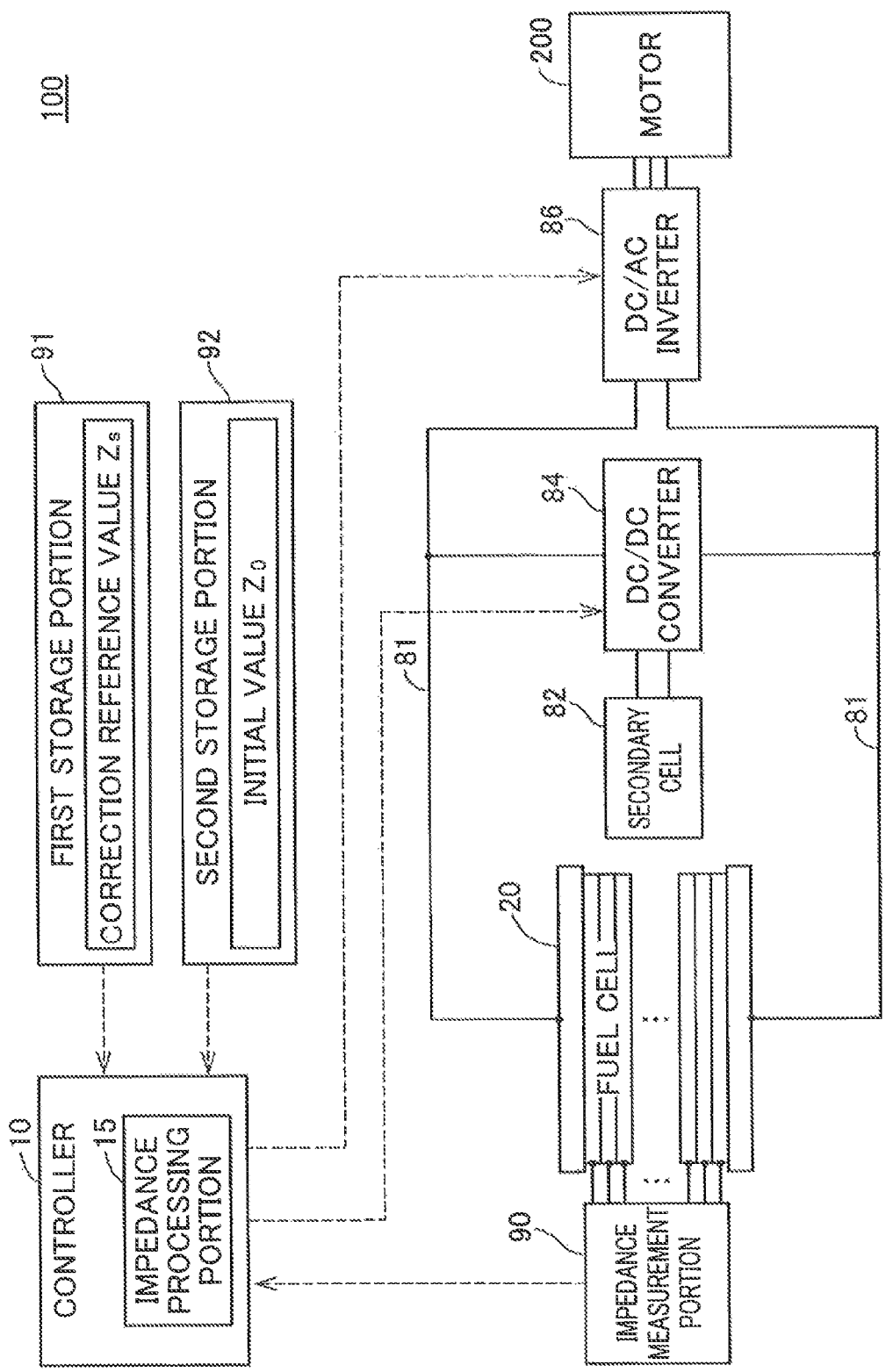
FIG. 2 is a schematic diagram showing an electrical configuration of a fuel cell system according to the first embodiment.

FIG. 2 is a schematic diagram showing the electrical configuration of fuel cell system 100. The fuel cell system 100 includes a secondary cell 82, a DC/DC converter 84, a DC/AC inverter 86, an impedance measurement portion 90, a first storage portion 91, and a second storage portion 92.

In the fuel cell system 100, the fuel cell 20 is connected to the DC/AC inverter 86 via a DC line 81. The DC/AC inverter 86 is connected to a three-phase AC motor 200 (hereinafter, simply called "motor 200"), which is a source of drive power of the fuel cell vehicle. The secondary cell 82 is connected to the DC line 81 via the DC/DC converter 84.

The secondary cell 82 is composed of a lithium ion battery, for example. The secondary cell 82 is charged by the output power from the fuel cell 20 and the regenerative electric power from the motor 200, allowing it to serve as a power source along with the fuel cell 20. The DC/DC converter 84 variably adjusts the voltage level of the DC line 81 based on an instruction from the controller 10, and thereby controls the current and voltage of the fuel cell 20, as well as the charging/discharging of the secondary cell 82. The DC/AC inverter 86 converts the DC power from the fuel cell 20 and the secondary cell 82 into AC power to supply to the motor 200. Also, when the motor 200 produces regenerative electric power, it converts the regenerative power into DC power.

The impedance measurement portion 90 corresponds to a subordinate concept of the impedance measurer of the present invention. The impedance measurement portion 90 applies the AC impedance method to obtain the impedance from each unit cell 21 and the fuel cell 20. It then outputs this impedance to controller 10. Impedance measurement portion 90 is equipped with an AC power supply, and applies high frequency AC to each unit cell 21 and the fuel cell 20 (for example, the number of kHz-MHz) to measure the DC resistance (described later) within each unit cell 21 impedance according to a command from controller 10. Hereinafter, this is referred to as simply "impedance of the fuel cell 20" without differentiating between the impedances obtained from each unit cell 21. The controller 10 uses the impedance of the fuel cell 20 as provided by the impedance measurement portion 90 to control the operation of fuel cell 20.

The first storage portion 91 is composed, for example, of a volatile memory such as SRAM. The first storage portion 91 stores information in a rewritable form, and allows it to be updated. The information stored in the first storage portion 91 is retained even after the fuel cell system 100 ceases operation, by receiving power from secondary cell 82. The first storage portion 91 stores the reference correction value $Z_s$ which is used to correct the impedance in the impedance acquisition process as explained later. The correction reference value $Z_s$ is then updated during the impedance correction reference value updating process as described later. The second storage portion 92 is composed, for example, of a nonvolatile memory such as ROM to store the information that does not require updating. The first storage portion 91 stores the initial value $Z_0$ for the correction reference value $Z_s$ which is used to correct impedance in the impedance acquisition process executed to control the operation of the fuel cell 20. The reference correction value $Z_s$ and initial value $Z_0$ are described along with an explanation of the impedance correction process and impedance correction reference value update process.

A2. Impedance of the Fuel Cell

Figure 3:
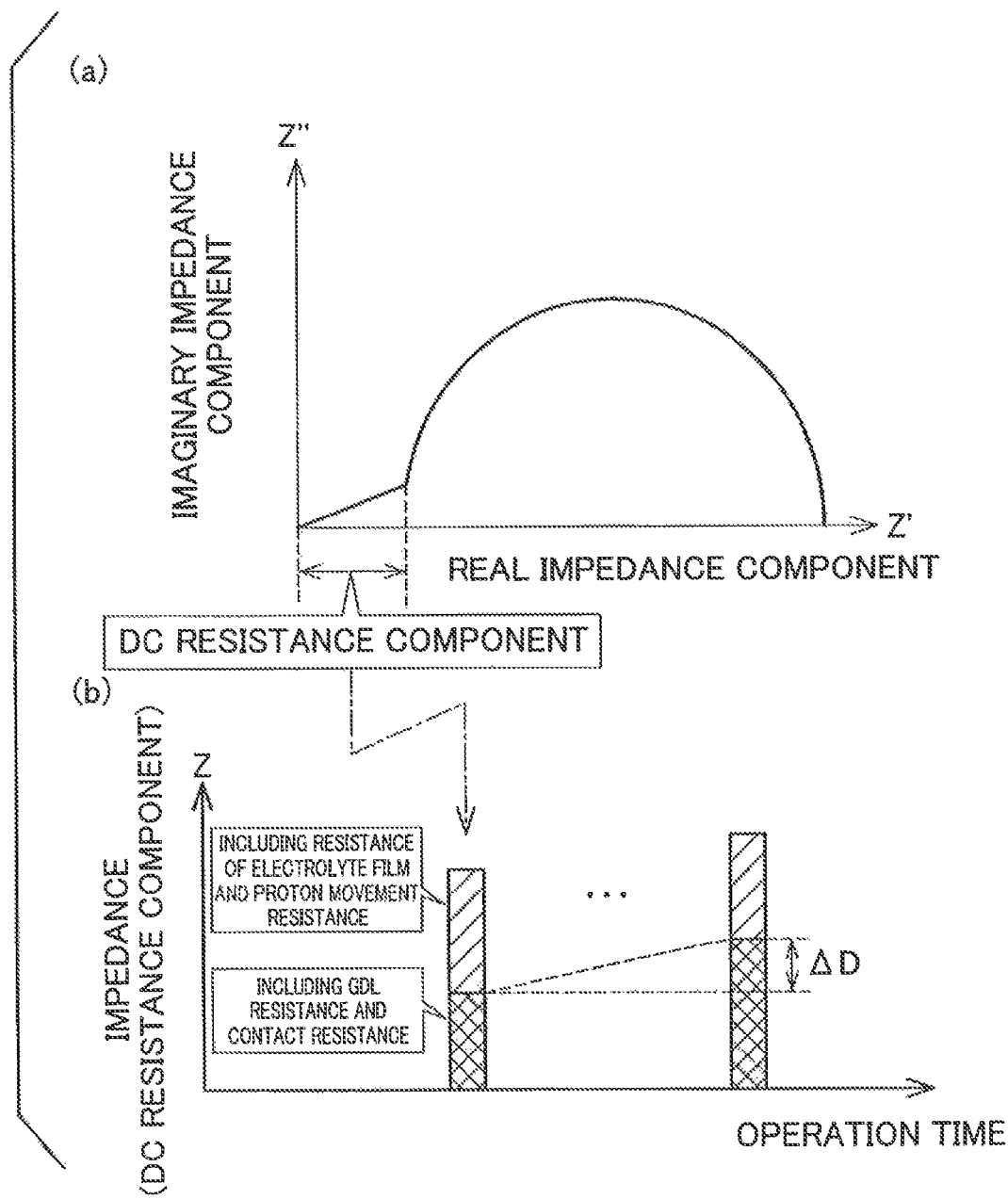
FIG. 3 is an explanatory diagram for explaining impedance of a fuel cell.

FIG. 3 explains the impedance of the fuel cell. In the section (a) of FIG. 3, an example of a Nyquist plot (Cole-Cole plot) obtained from a general polymer electrolyte fuel cell based on the AC impedance method is shown. In the section (b) of FIG. 3, a graph of the aging of the DC component in the fuel cell impedance is illustrated. The impedance of the fuel cell includes the AC resistance component, represented by the semi-circular portion of the Nyquist plots, and the DC resistance component, represented by the straight-line portion in the section (a) of FIG. 3. As described above, the impedance measurement portion 90 in this design uses a high-frequency alternating current to measure the DC resistance of the impedance.

The DC resistance component of the impedance includes components such as electrolyte membrane resistance and proton transfer resistance that may vary according to the fuel cell moisture content in the fuel cell in the section (b) of FIG. 3. Therefore, by obtaining the correlation between the fuel cell moisture content and DC resistance beforehand, it is possible to determine the moisture content and moisture status of the fuel cell based on the DC resistance component of impedance.

The DC resistance component of impedance includes components such as the resistance of conductive members such as the gas diffusion layer and the separator, and the contact resistance between these conductive members, values which are hardly affected by the fuel cell moisture content. These components tend to increase over time since they are affected by factors such as oxidation of the conductive members or aging of the fuel cell stack fastenings. In the fuel cell system 100 in this first embodiment, the value of fuel cell 20 impedance, which is used in the operation control of fuel cell 20, is corrected to reduce the influence of aging so that the value of fuel cell 20 impedance more accurately represents moisture content which is amount of moisture included in the fuel cell 20.

A3. Fuel Cell System Operation Control

Figure 4:
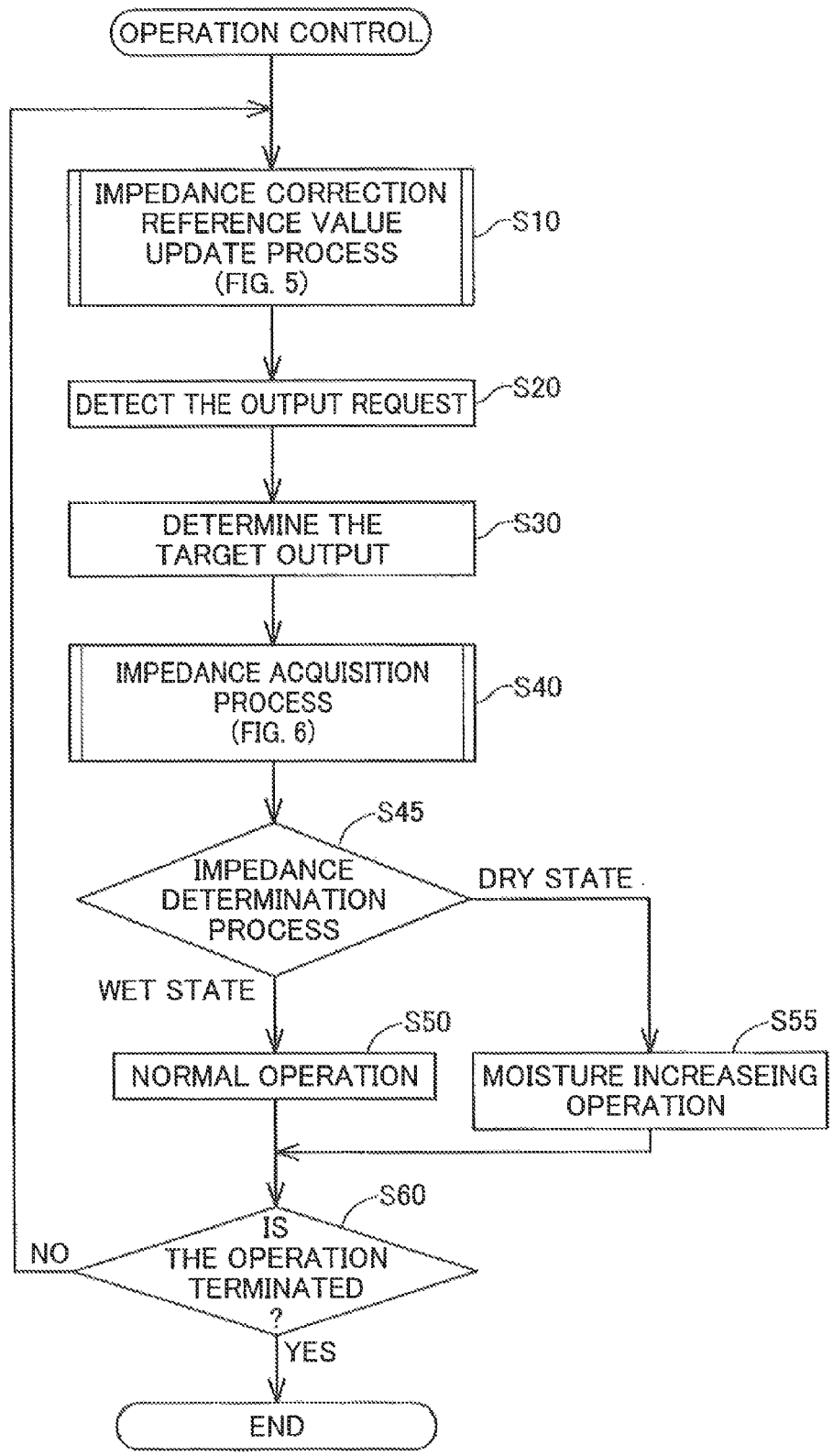
FIG. 4 is an explanatory diagram showing a flow of an operation control of a fuel cell performed by a controller.

FIG. 4 shows the sequence of operation control for fuel cell 20 as executed by controller 10. In step S10, the impedance processing portion 15 in the controller 10 executes the impedance correction reference value updating process to update the correction reference value $Z_s$ which is used to correct impedance in the impedance acquisition process in step S40. The correction reference value and the correction reference value update process will be described later.

In step S20, the controller 10 detects the user's output request. In step S30, the controller 10 determines the target power to output to the fuel cell 20 based on the user's output request. In step S40, the impedance processing portion 15 executes impedance acquisition processing to obtain the impedance of the fuel cell 20 by the impedance measurement portion 90. The impedance acquisition processing uses the correction reference value $Z_s$ to correct the raw measured value for impedance. The impedance acquisition processing will be described later.

In step S45, the controller 10 executes the impedance determination process and switches the reactant gas supply control for the fuel cell 20 to either normal operation or increasing moisture operation based on the corrected impedance value. When the corrected impedance is less than or equal to a predetermined value, the controller 10 executes the normal operation in step S50 for the fuel cell 20 in wet state, meaning there is sufficient moisture content. On the other hand, when the corrected impedance is greater than or equal to the predetermined value, controller 10 executes the increasing moisture operation in step S55 for the fuel cell 20 in dry state, meaning there is insufficient moisture content.

In the step S50 normal operation, the controller 10 uses a predetermined control map that is prepared in accordance with the target output determined in step S20, to set a target pressure and a target flow rate to supply reactant gas to fuel cell 20. Hereafter, the target pressure of the reactant gas under normal operations is referred to as the "first target pressure". The controller 10 start the supplying the reactant gas to cathode gas supply portion 30 and anode gas supply portion 50 at the target flow rate and first target pressure.

In the increasing moisture operation in step S55, the controller 10 determines the target flow rate for the reactant gases just as with normal operations, and sets the target pressure higher than that of the first target pressure for normal operations, hereinafter referred to as the "second target pressure". The controller 10 make the cathode gas supply portion 30 and the anode gas supply portion 50 start the reactant gas supply operation according to the target flow rate and second target pressure. In the increasing moisture operation, the reactant gas is supplied to fuel cell 20 at a pressure higher than that of normal operations. This allows the partial pressure of water vapor in the exhaust gas to decrease, which makes it possible to reduce the amount of moisture carried away from fuel cell 20 by the reactant gas. This means that the moisture content in fuel cell 20 may be increased higher than that of normal operations.

The controller 10 repeats the processes of steps S10-S55 until the operation of the fuel cell system 100 is terminated in step S60. Thus, in the fuel cell system 100 in this first embodiment, the moisture content of fuel cell 20 is determined based on the impedance of fuel cell 20. In the case that the fuel cell 20 is determined to be in a dry state, the increasing moisture operation is executed to increases the moisture content of fuel cell 20 in the reactant as supply operation. Accordingly, decrease in power generation efficiency due to moisture shortage in the fuel cell 20 is suppressed.

Figure 5:
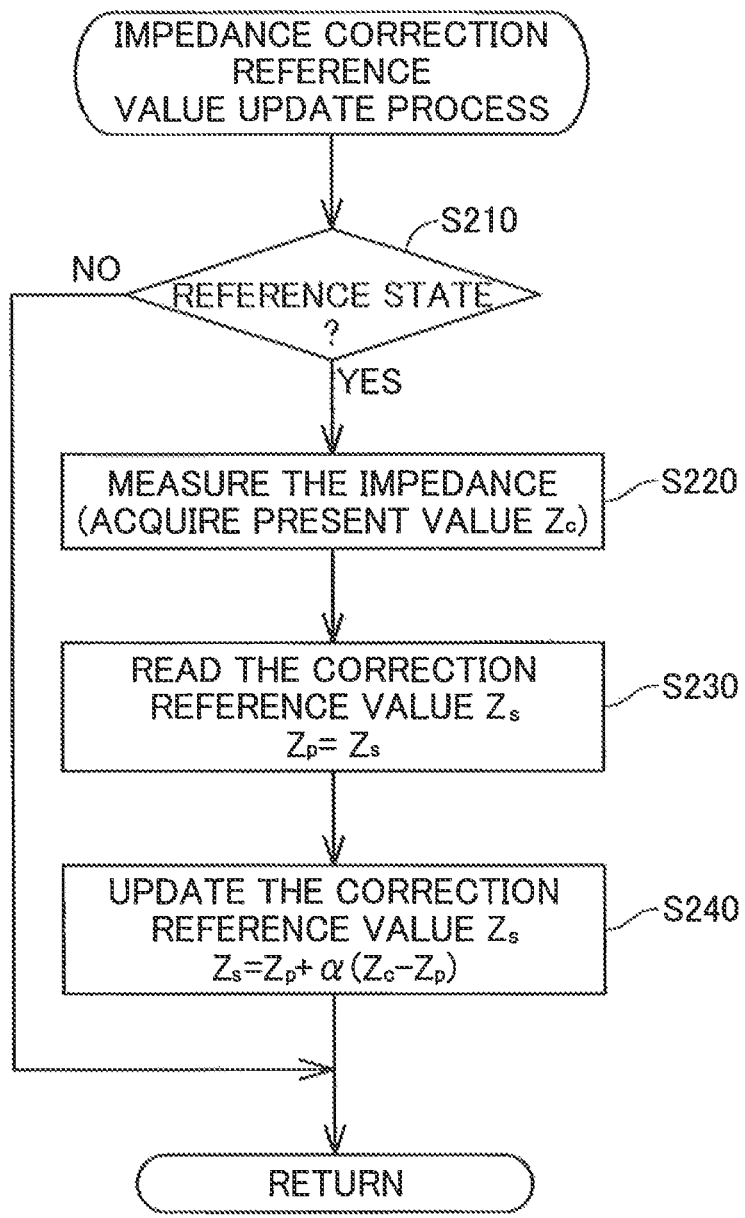
FIG. 5 is an explanatory diagram showing a flow of an impedance correction reference value update process.

FIG. 5 shows the sequence of the impedance correction reference value updating process executed by the impedance processing portion 15 in step S10 in FIG. 4. The correction reference value $Z_s$ corresponds to a subordinate concept of first impedance value in the present invention. When the impedance of fuel cell 20 is corrected, the correction reference value $Z_s$ is used as the reference value. The correction reference value $Z_s$ represents the impedance of fuel cell 20 in a predetermined reference condition where the electrolyte membrane is confirmed to be in wet state.

The correction reference value $Z_s$ is sequentially updated based on the impedance obtained by impedance measurement portion 90 when the fuel cell 20 is in the reference condition.

In step S210 impedance processing portion 15 determines whether or not fuel cell 20 is in the predetermined reference condition based on its operating temperature. The impedance processing portion 15 determines that fuel cell 20 is in the reference state when both of the following conditions are satisfied: (a), (b).

(a) the operating temperature of fuel cell 20 is equal or greater than $T_1$ and less than $T_2$.

(b) the operating temperature of fuel cell 20 is equal or less than $T_3$ for a predetermined period p.

In the condition (a), the intention of the condition that the operating temperature of fuel cell 20 is greater than $T_1$ is to suppress to add the noise, such as the diffusion resistance of the reactant gas to the impedance measurement of the fuel cell 20. The temperature assigned as $T_1$ may be determined experimentally in advance based on the frequency of the alternating current used to measure impedance. In this first embodiment, $T_1$ is 55° C.

In the condition (a), the intention of the condition that the operating temperature of fuel cell 20 is less than $T_2$ is to ensure that the current operating temperature of fuel cell 20 is not causing the electrolyte membrane to dry out. The temperature assigned as $T_2$ may be determined experimentally in advance, as a temperature unlikely to cause the electrolyte membrane to dry out. In this first embodiment, $T_2$ is 60° C.

The condition (b) intends to ensure that the operating temperature of fuel cell 20 is not the significantly high temperature, for example about 90° C., just before. This is because immediately after the operating temperature of the fuel cell 20 is the significantly high temperature, the electrolyte membrane may still be in a dry state. The temperature assigned as $T_3$ in the condition (b) may be determined based on the average operating temperature of fuel cell 20, and like $T_2$ in the condition (a), it may be determined experimentally in advance, as a temperature unlikely to cause the electrolyte membrane to dry out. In this first embodiment, $T_3$ is 60° C., which is same as temperature $T_2$ in the condition (a).

The predetermined period p in the condition (b) shall be preferably approximately the period when the dry state of the electrolyte membrane is canceled when the operating temperature of the fuel cell 20 returns from significantly higher temperature, for example about 90° C., to normal temperature, for example about 60° C. In this first embodiment, the predetermined period p is 60 seconds.

If at least one of the conditions (a) or (b) is not satisfied, as the case that the fuel cell 20 is not under prescribed standard condition, the impedance processing portion 15 terminates the impedance correction reference value update process as shown NO of step S210. In this case, the correction reference value $Z_s$ does not get updated, and the operation control of the fuel cell 20 continues beyond the step S20 of FIG. 3.

If at least one of the conditions (a) or (b) is satisfied, the impedance processing portion 15 determines that the fuel cell 20 is under prescribed standard condition as shown by YES of step S210. In this case, the impedance of the fuel cell 20 used for updating the correction reference value $Z_s$ is obtained from the impedance measurement portion 90 in step S220. Hereafter, the impedance of the fuel cell 20 obtained in step S220 is called as the "the present value $Z_c$".

In step S230, the correction reference value $Z_s$ saved in the first storage portion 91 in FIG. 2 is read out as the previous value $Z_p$ ($Z_p=Z_s$) by the impedance processing portion 15. If the impedance correction reference value update process is for the first time, the initial value $Z_O$ of the correction reference value $Z_s$ saved in the second storage portion 92 is set as the previous value $Z_p$. The initial value $Z_O$ is a value determined experimentally beforehand and represents the impedance of the fuel cell 20 when it is under prescribed condition at the time of shipping from the factory. The previous value $Z_p$ corresponds to the subordinate concept of the original value in the present invention.

In step S240, the impedance processing portion 15 updates the correction reference value $Z_s$ in order to mitigate the difference between the previous value $Z_p$ and the present value $Z_c$ in the updated correction reference value $Z_s$ by performing a correction which reflects this difference to the previous value $Z_p$ that is the present correction reference value $Z_s$. Specifically, in order to obtain the new correction reference value $Z_s$, the difference obtained by subtracting the previous value $Z_p$ from the present value $Z_c$ is multiplied with a coefficient α, and adds to the previous value $Z_p$ as shown in the following formula (A). The coefficient α is less than 1.

$$Z_s = Z_p + \alpha(Z_c - Z_p) \quad (A)$$

The coefficient α is a so-called the smoothing factor, and it corresponds to a subordinate concept of the correction strength which expresses an extent that the difference between the present value $Z_c$ and the previous value $Z_p$ is reflected to the correction reference value $Z_s$. By multiplying the coefficient α with the difference between the present value $Z_c$ and the previous value $Z_p$, even if the present value $Z_c$ accidentally is obtained as an extremely large value due to factors such as measurement error etc., it becomes possible to prevent the correction reference value $Z_s$ being immediately affected by such effect. Moreover, the above formula (A) may be expanded as the following formula (A'). As shown in the formula (A') below, the above correction due to the coefficient α, may be interpreted as applying the weightage of the present value $Z_c$ and the previous value $Z_p$.

$$Z_s = \alpha Z_c + (1-\alpha) Z_p \quad (A')$$

The impedance processing portion 15 updates by rewriting the correction reference value $Z_s$ as the corrected correction reference value $Z_s$ of the first storage portion 91 shown in FIG. 2, and ends the impedance correction reference value updating process. Subsequently, the operation control of the fuel cell 20 by the controller 10 is continued beyond step S20 in FIG. 3.

Thus, in this first embodiment, in the reference state in which it is guaranteed that the wet state of the electrolyte membrane of the fuel cell 20 is excellent, the present value $z_p$ is acquired in order to update the correction reference value $Z_s$. Therefore, the reliability of the correction reference value $Z_s$ is enhanced as a reference value for correcting the impedance. Also, the correction reference value $Z_s$ is sequentially updated, and the status change of the fuel cell 20 is reflected properly in real time in the correction reference value $Z_s$. Therefore, the reliability of the impedance of the correction of the impedance in the impedance acquisition process described below is ensured.

Figure 6:
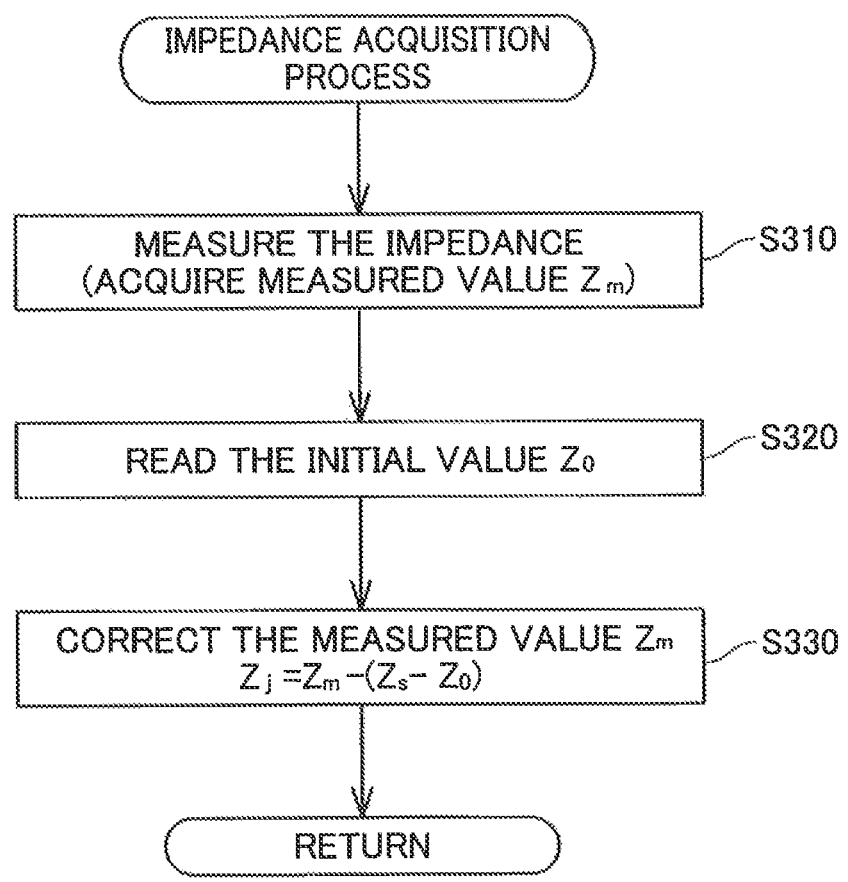
FIG. 6 is an explanatory diagram showing a flow of an impedance acquisition process.

FIG. 6 is an explanatory diagram depicting the flow of the impedance acquisition process in step S40 in FIG. 4 executed by the impedance processing portion 15. In step S310, the impedance processing portion 15 acquires the measured value $Z_m$ of the present impedance in the fuel cell 20 by the impedance measuring portion 90. The measured value $Z_m$ corresponds to the subordinate concept of the second impedance value in the present invention. In step S320, the impedance processing portion 15 reads the initial value $Z_0$ of the correction reference value $Z_s$ from the second storage portion 92 in FIG. 2.

In step S330, the impedance processing portion 15 corrects the measured value $Z_m$ by using the correction reference value $Z_s$ and the initial value $Z_0$. More specifically, the impedance processing portion 15 performs the correction by subtracting the difference between the correction reference value $Z_S$ and the initial value $Z_0$ from the measured value $Z_m$. With this correction, the impedance processing portion 15 acquires the determination impedance $Z_j$, which is the corrected impedance used in the determination processing in step S45 as shown in formula (B) below.

$$Z_j = Z_m - (Z_s - Z_0) \quad (B)$$

The difference $(Z_s - Z_0)$ between the correction reference value $Z_s$ and the initial value $Z_0$ in the above formula (B) corresponds to the increased amount ΔD of the impedance due to aged deterioration shown in the graph in the section (B) of FIG. 3. In other words, the determination impedance $Z_j$ obtained from the above correction corresponds to a value from which the increased component of the impedance due to aging has been removed, and has been optimized so as to appropriately indicate the moisture content in the present fuel cell 20.

As described above, in the fuel cell system 100 of the this first embodiment, the moisture condition inside the fuel cell 20 is determined based on the determination impedance $Z_j$ obtained by correcting the measured value $Z_m$ corresponding to the subordinate concept of the second impedance value by using the correction reference value $Z_s$ corresponding to the subordinate concept of the first impedance value. Therefore, operation control of the fuel cell 20 according to the moisture condition in the fuel cell 20 is more appropriately performed.

B. Second Embodiment

Figure 7:
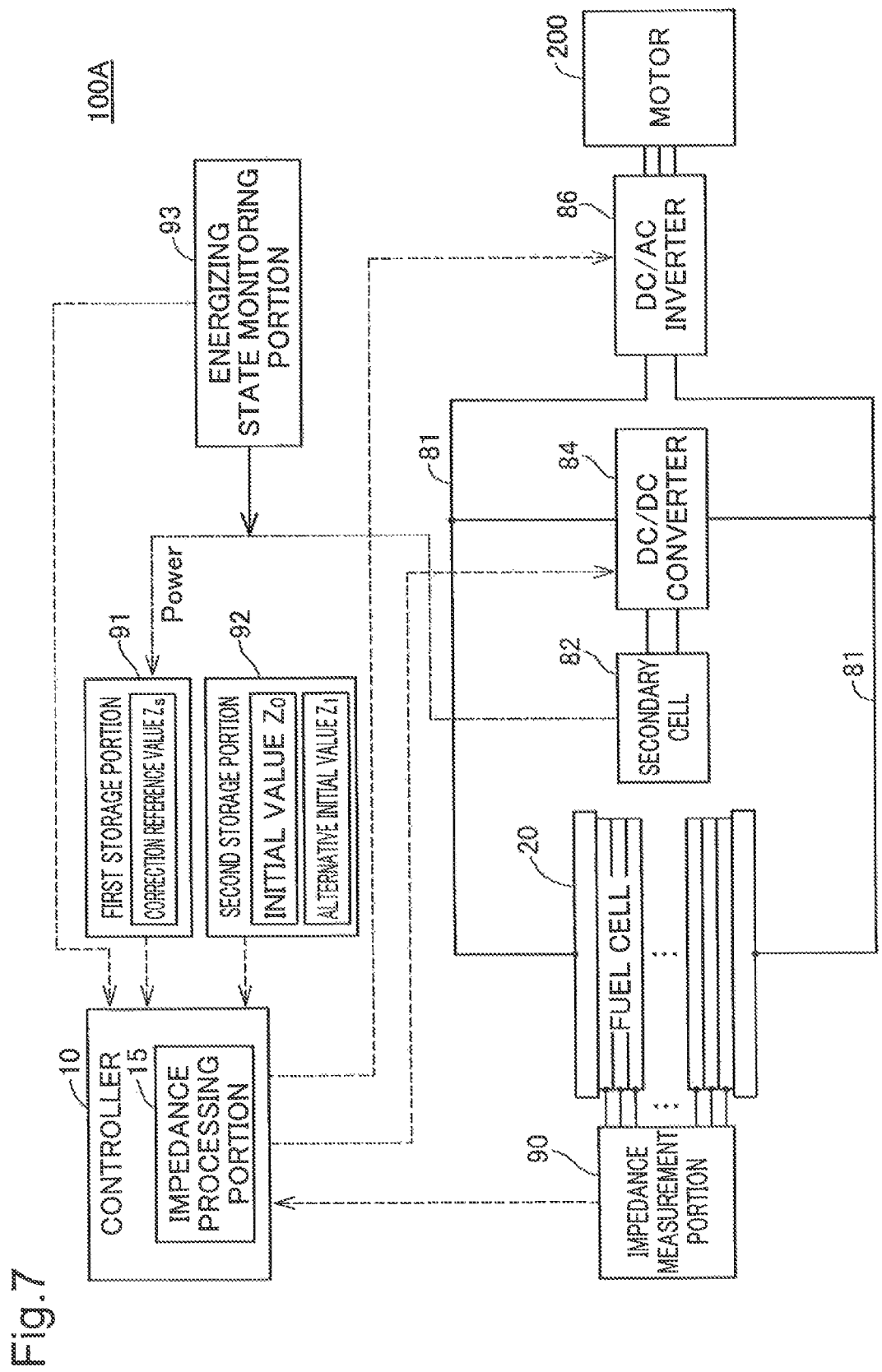
FIG. 7 is a schematic diagram showing an electrical configuration of a fuel cell system according to a second embodiment.

FIG. 7 is a schematic view showing the electrical configuration of a fuel cell system 100A as the second embodiment of the present invention. Except for providing a point provided with an energization state monitoring portion 93, and storing the alternative initial value $Z_1$, in addition to the initial value $Z_0$, in the second storage portion 92, the configuration of the fuel cell system 100A in the second embodiment is substantially the same as the configuration of the fuel cell system 100 in the first embodiment. The operation control of the fuel cell 20 in the fuel cell system 100A in the second embodiment, except for the fact that the flow of the impedance correction reference value updating processing is different, is substantially the same as the operation control of the first embodiment.

As described in the first embodiment, the first storage portion 91 holds the stored information by the electric power of a secondary cell 82 during the operation stop of the fuel cell system 100A. The energization state monitoring portion 93 monitors the status of energization from the secondary cell 82 to the first storage portion 91.

There is a possibility that the energization of the first storage unit 91 from the secondary cell 82 gets interrupted because of unforeseen circumstances such as, for example, when the secondary cell 82 is removed from the fuel cell vehicle for the maintenance of the fuel cell vehicle, or if the amount of charge of the secondary cell 82 is insufficient. The energization state monitoring portion 93, during the operation stoppage of the fuel cell system 100A, if the disruption of the power supply to such first storage section 91 is detected, measures the duration of such disruption. The energization state monitoring portion 93, after starting of the fuel cell system 100A, transmits the detection result to the controller 10.

FIG. 8 is an explanatory diagram showing the flow of the impedance correction reference value updating process of the second embodiment that is executed by the impedance processing portion 15. The impedance correction reference value updating process in the second embodiment, except for executing the processes in steps S201 and S202 before the step S210, is substantially same as in the first embodiment. In FIG. 8, for convenience, the illustration of the processing after the step S210 has been omitted.

In step S201, the impedance processing portion 15 checks for the existence of the history whether the stored information in the first storage section 91 was reset, in other words initialized, on the basis of the detection result from the energization state monitoring portion 93. In the case that the impedance processing portion 15, with the help of the energization state monitoring portion 93, detects the disruption of the power supply to the first storage portion 91 during the stoppage of the fuel cell system 100, and the duration of the interruption is longer than a predetermined time, the impedance processing portion 15 determines that the information stored in the first storage portion 91 has been reset.

In this case, the impedance processing portion 15 executes the process of step S202 as shown YES of step S201.

In case that the energization state monitoring portion 93 does not detect a disruption in power supply from the secondary cell 82 to the first storage portion 91 that is longer than the predetermined period, the impedance processing portion 15 determines that the information stored in the first storage portion 91 has been preserved. In this case, the impedance processing portion 15 starts the processing after step S210 in FIG. 4 described in the first embodiment.

In step S202, the impedance processing portion 15 executes the process for changing the process to expedite the recovery of the correction reference value $Z_s$ that was reset. The impedance processing portion 15 increases the value of the coefficient $\alpha$, which is the correction strength contained in the formula (A) described above, more than in the process of previous time. For example, if the coefficient $\alpha$, is 0.5, it is increased to 0.8. With this, during the updating of the correction reference value $Z_s$ in step S240 in FIG. 5, the degree of the difference between the present value $Z_c$ and previous value $Z_p$ getting reflected is increase, the number of updates before the correction reference value $Z_S$ reaches a value before the reset becomes less, and the learning period of correction reference value $Z_s$ is shortened.

Further, the impedance processing portion 15 also sets the correction reference value $Z_s$ to alternate initial value $Z_1$ instead of to the initial value $Z_0$. The alternate initial value $Z_1$ is an average value between the initial value $Z_0$ with the fuel cell 20 at the time of factory shipping as the reference, and the post-durability test reference impedance $Z_2$ that represents an impedance when the fuel cell 20 is in a specific reference state after durability test assuming a use of long period, for example about few tens of years. Alternate initial value $Z_1$ is determined by the following formula (C).

$$Z_1 = (Z_0 + Z_2)/2 \quad (C)$$

FIG. 9 is an explanatory diagram showing the effect when the correction reference value $Z_s$ is set to the alternate initial value $Z_1$ instead of the initial value $Z_0$. FIG. 9 exemplifies a graph in which the vertical axis shows the correction reference value $Z_s$, and the horizontal axis shows the updated count of the correction reference value $Z_s$. The value LV of the vertical axis in the graph of FIG. 9 indicates a value wherein the correction reference value $Z_s$ before the erasure immediately before the stored information in the first storage portion 91 is reset, that is, a value where the correction reference value $Z_s$ shall be restored.

In case the first correction reference value $Z_s$ after resetting the of the first storage portion 91 is set to initial value $Z_0$, as shown in dot line graph Ga, the correction reference value $Z_s$ increases each time the updating process of step S240 is repeated, and continues to approach the value LV before the reset of the first storage portion 91. In case the first correction reference value $Z_s$ is set to the post-durability test reference impedance $Z_2$, as shown in dashed-line graph Gb, the correction reference value $Z_s$ decreases with each repetition of the update process of step S240, and continues to approach the value LV before the reset of the first storage portion 91.

If the first correction reference value $Z_s$ is set to alternate initial value $Z_1$, the correction reference value $Z_s$ from the beginning becomes a value nearer to the value LV which is the value before reset. Therefore, it is possible to reach the value LV before reset in less number of updates compared to the case of setting to the above initial value $Z_0$ or post-durability test reference impedance $Z_2$ as shown by the solid line graph Gc. Further, it is not necessary for alternative initial value $Z_1$ to be the average value between the initial value $Z_0$ and post-durability test reference impedance $Z_2$, and as shown in the following inequality equation (D), it may be a value that is greater than the initial value $Z_0$, and smaller than the post-durability test reference impedance $Z_2$.

$$Z_0 < Z_1 < Z_2 \quad (D)$$

As described above, if it is a fuel cell system 100A in the second embodiment, even if the reference correction value $Z_s$ of the first storage portion 91 is lost, the period till its recovery is shortened. In addition, if it is a fuel cell system 100A in the second embodiment, it is possible to achieve the same effect as that described in the first embodiment.

C. Modifications

C1. Modification 1:

In each of the above embodiments, the controller 10 performs the operation control of the fuel cell 20 by using the impedance $Z_j$ for determining the corrected value of the measured value $Z_m$ of the impedance corresponding to the subordinate concept of the second impedance value by using the reference correction value $Z_s$ corresponding to the subordinate concept of the first impedance value. Alternatively, the controller 10 need not perform the correction process to correct the measured value $Z_m$ by using the reference correction value $Z_m$. The controller 10 may perform the operation control of the fuel cell 20 by using the reference correction value $Z_s$ and the measured value $Z_m$. For example, controller 10, by changing the threshold value of the determination process in step S10 as per the reference correction value $Z_s$, may also execute the determination process of step S10 by using the measured value $Z_m$ as the impedance for determination.

C2 Modification 2:

In each of the above embodiments, as an operation control of the fuel cell 20, and depending on the impedance of the fuel cell 20, the controller 10 performs the supply control of the reactant gas to the fuel cell 20 by switching between normal operation and increasing moisture operation. In contrast to this, the controller 10, as an operation control of the fuel cell 20, may also perform other operation controls. For example, the controller 10 may also perform reactant gas supply control that varies the supply flow rate or supply pressure of the reactant gas as per the impedance of the fuel cell 20. Alternatively, the controller 10, depending on the impedance of the fuel cell 20, may also execute operation control for determining the execution timing for the scavenging process for scavenging the interior of the fuel cell 20. The controller 10 may perform the operation control for controlling the operating temperature of the fuel cell 20 by changing the circulation flow rate of the coolant as per the impedance of the fuel cell 20.

C3. Modification 3:

In each of the above-described embodiments, the controller 10 executes operation control of the fuel cell 20 by using the impedance of the fuel cell 20 as the value that expresses the wet state inside the fuel cell 20. In contrast, the controller 10 may execute operation control of the fuel cell 20 by using the impedance of the fuel cell 20 as the value that expresses any other state of the fuel cell 20. For example, the controller 10 may use the impedance of the fuel cell 20 as a value that expresses the movement resistance of protons in the fuel cell 20, and execute operation control in which the desired output of the fuel cell 20 is changed according to the impedance of the fuel cell 20.

C4. Modification 4:

In each of the above-described embodiments, the impedance processing portion 15 uses the present value $Z_c$ with respect to the correction reference value $Z_s$, and performs a correction process of reflecting the difference between the present value $Z_c$ and the previous value $Z_p$ so as to reduce the difference between the present value $Z_c$ and the previous value $Z_p$. In contrast, the impedance processing portion 15 may perform any other correction by using the present value $Z_c$ with respect to the correction reference value $Z_s$. The impedance processing portion 15 may also perform a correction process of substituting the correction reference value $Z_s$ in the present value $Z_c$ each time the present value $Z_c$ acquired. If there is a difference between the present value $Z_c$ and the previous value $Z_p$, the impedance processing portion 15 may perform correction to increase or reduce the correction reference value $Z_s$ only by as much as the predetermined correction amount. The impedance processing portion 15 may also perform an arithmetic processing of acquiring the correction reference value $Z_s$ by subtracting the difference between the present value $Z_c$ and the previous value $Z_p$ from the present value $Z_c$, without multiplying with the coefficient $\alpha$.

C5. Modification 5:

In each of the above-described embodiments, the impedance processing portion 15 performs the judgment of whether or not the fuel cell 20 is in the predetermined reference state on the basis of the operating temperature of the fuel cell 20. In contrast, the impedance processing portion 15 may perform the judgment of whether or not the fuel cell 20 is in the predetermined reference state on the basis of a parameter other than the operating temperature of the fuel cell 20. For example, when the fuel cell 20 continues with the generation of power within a predetermined range of the present value for a predetermined time period, the impedance processing portion 15 may determine that the fuel cell 20 is in a predetermined reference state.

C6. Modification 6:

In the fuel cell system 100A according to the above-described second embodiment, the process of increasing the coefficient $\alpha$ and the process of setting the correction reference value $Z_s$ in the alternate initial value $Z_1$ are executed when the information stored in the first storage portion 91 is reset. In contrast, only one of the process of increasing the coefficient $\alpha$ and the process of setting the correction reference value $Z_s$ in the alternate initial value $Z_1$ may be executed when the information stored in the first storage portion 91 is reset.

C7. Modification 7:

In the fuel cell system 100A according to above-described second embodiment, the impedance processing portion 15 performs the process of increasing the coefficient $\alpha$ when the information stored in the first storage portion 91 is reset. In contrast, the impedance processing portion 15 may perform the process of changing the coefficient $\alpha$ in various conditions rather than only when the information stored in the first storage portion 91 is reset. For example, the impedance processing portion 15 may change the coefficient $\alpha$ when an instruction for changing the learning speed of the correction reference value $Z_s$ is received from the user, and the impedance processing portion complies with the instruction.

C8. Modification 8:

In each of the above embodiments, rather than differentiating the impedance of each unit cell 21 acquired by the impedance measurement portion 90, it is explained as the impedance of the fuel cell 20. In the fuel cell systems 100 and 100A according to each of the above-described embodiments, the operation control of the fuel cell 20 may be executed on the basis of the impedance of each unit cell 21. For example, when it is detected that the impedance of some of the unit cells 21 is higher than that of the other unit cells 21, an operation control to temporarily increase the output current of the fuel cell 20, or an operation control to temporarily increase the flow of the reaction gas may be executed.

C9. Modification 9:

The fuel cell systems 100 and 100A according to each of the above-described embodiments are mounted on a fuel cell vehicle. In contrast, the fuel cell systems 100 and 100A may not necessarily be mounted on a fuel cell vehicle, for example, the fuel cell systems may be installed in a building or facility.

C10. Modification 10:

In the fuel cell systems 100 and 100A according to each of the above-described embodiments, a polymer electrolyte fuel cell is used as the fuel cell 20. In contrast, the fuel cell 20 may not be a polymer electrolyte fuel cell, but may be a fuel cell of various other types.

The present invention is not restricted to the above-described embodiments, examples, and modifications, and may be implemented in various configurations as long as the jist of the invention is not lost. For example, the technical characteristics described in the embodiments, examples, and modifications corresponding to the technical characteristics in each form described in the SUMMARY OF INVENTION column may be appropriately substituted or combined together in order to resolve some or all of the above-described issues, or to realize some or all of the above-described effects. Moreover, if the technical characteristics are not described as compulsory in the SPECIFICATIONs, they may be deleted appropriately. Moreover, in each of the above-described embodiments and modifications, some or all of the functions and processes implemented by software may be implemented by hardware. Also, some or all of the functions and processes implemented by hardware may be implemented by software. Various types of circuits, such as an integrated circuit, a discrete circuit, or a circuit module that is a combination of these circuits may be used as hardware.

What is claimed is:

1. A fuel cell system, comprising:
   a fuel cell;
   an impedance measurer that measures an impedance of the fuel cell; and
   a controller configured to perform an operation control of the fuel cell, wherein the controller is further configured to obtain a first impedance value expressing the impedance of the fuel cell when the fuel cell is generating electric power in a in a predetermined reference condition where the electrolyte membrane is confirmed to be in a wet state,
   acquire a second impedance value expressing the impedance of the fuel cell by measuring the impedance measurer when the fuel cell is generating the electric power, and perform operation control of generating electric power in the fuel cell using the first impedance value and the second impedance value.

2. The fuel cell system according to claim 1, wherein
   the controller is further configured to correct the second impedance value by using the first impedance value, and perform the operation control of the fuel cell on the basis of the second impedance value after correction.

3. The fuel cell system according to claim 1, further comprising:
a storage portion for storing the first impedance value, wherein
the controller is further configured to execute an update process that updates the first impedance value stored in the storage portion when the fuel cell reaches the predetermined reference condition during the operation control of the fuel cell,
the controller, in the update process, reacts the first impedance from the storage portion as an original value,
obtains the impedance of the fuel cell by the impedance measurer as a present value, calculates an updated first impedance value by using the original value and the present value, and stores the updated first impedance value in the storage portion as the first impedance value.

4. The fuel cell system according to claim 3, further comprising:
a temperature detect portion that detects an operating temperature of the fuel cell, wherein
the controller is further configured to determine that the fuel cell reaches the predetermined reference condition when the operating temperature of the fuel cell is within a predetermined temperature range, and execute the update process.

5. The fuel cell system according to claim 4, wherein
the controller is further configured to determine that the fuel cell reaches the predetermined reference condition when the operating temperature of the fuel cell is within the predetermined temperature range during a predetermined time period, and execute the update process.

6. The fuel cell system according to claim 3, wherein
the controller is further configured to update the first impedance value with reflecting a difference between the present value and the original value so that a difference between the present value and the updated first impedance value is reduced.

7. The fuel cell system according to claim 6, wherein
the controller is further configured to update the first impedance value by using a correction strength that expresses an extent of reflection of the difference between the present value and the original value in the update process.

8. The fuel cell system according to claim 7, further comprising:
an initialization detector configured to detect a history of initialization of the storage portion, wherein
the controller is further configured to change the correction strength so that the extent of reflection of the difference between the present value and the original value becomes large when the history of initialization of the storage portion is detected by the initialization detector.

9. The fuel cell system according to claim 6, wherein
the storage portion is a first storage portion, and the fuel cell system further comprises
a second storage portion configured to store an initial value of the first impedance value; and
an initialization detector configured to detect a history of initialization of the first storage portion, wherein
the controller is further configured to set a value that is larger than the initial value of the first impedance value stored in the second storage portion as the original value, and restart the update of the first impedance value in the update process, when a history of initialization of the first storage portion is detected by the initialization detector.

10. The fuel cell system according to claim 1, further comprising:
a reaction gas supply portion for supplying reaction gas to the fuel cell, wherein
the controller is further configured to control the reaction gas supply portion in the operation control of the fuel cell using the first impedance value and the second impedance value.

11. A control method of a fuel cell system, comprising:
a first impedance acquisition process of obtaining a first impedance value that expresses an impedance of a fuel cell when the fuel cell is generating electric power in a predetermined reference condition where the electrolyte membrane is confirmed to be in a wet state;
a second impedance acquisition process of acquiring a second impedance value expressing the impedance of the fuel cell by measuring the impedance of the fuel cell when the fuel cell is generating the electric power; and
a control process of executing the operation control of generating electric power in the fuel cell by using the first impedance value and the second impedance value.

12. The control method according to claim 11, further comprising:
a correct process of correcting the second impedance value by using the first impedance value, wherein
the control process executes the operation control of the fuel cell on the basis of the second impedance value after correction.

13. The control method according to claim 11, further comprising:
an update process of updating the first impedance value, which is stored in a storage portion when the fuel cell reaches the predetermined reference condition during the operation control of the fuel cell, wherein
the update process includes reading the first impedance value from the storage portion as an original value,
obtaining the impedance of the fuel cell by measuring the fuel cell as a present value,
calculating an updated first impedance value by using the original value and the present value, and
storing the updated first impedance value in the storage portion as the first impedance value.

14. The control method according to claim 13, further comprising:
a temperature detect process of detecting an operating temperature of the fuel cell, and
a determine process of determining that the fuel cell reaches the predetermined reference condition which causes updating the first impedance value, when the operating temperature of the fuel cell is within a predetermined temperature range.

15. The control method according to claim 14, wherein
the determine process of determining that the fuel cell reaches the predetermined reference condition which causes updating the first impedance value, when the operating temperature of the fuel cell is within the predetermined temperature range during a predetermined time period.

16. The control method according to claim 13, wherein
the update process is a process of updating the first impedance value with reflecting a difference between the present value and the original value in order to reduce a difference between the present value and the updated first impedance value.

17. The control method according to claim 16, wherein the update process is a process of updating the first impedance value by using a correction strength that express a extent of reflection of the difference between the present value and the original value.

18. The control method according to claim 17, further comprising:

an initialization history detection process of detecting a history of initialization of the storage portion; and a correction strength change process of changing the correction strength so that the extent of reflection of the difference between the present value and the original value becomes large when the history is detected in the initialization history detection process.

19. The control method according to claim 16, wherein the storage portion is a first storage portion, and the control method further comprises an initialization history detection process of detecting a history of initialization of the first storage portion; and a setting value process of setting a secondary initial value, which is larger than an initial value of the first impedance value that is stored in a second storage portion in advance, as the original value when a history of initialization of the first storage portion is detected, wherein the update process is restarted and uses the secondary initial as the initial value of the first impedance value after the history of initialization of the first storage portion is detected.

20. The control method according to claim 11, wherein the control process includes a process of controlling a supply of a reaction gas to the fuel cell on the basis of the first impedance value and the second impedance value.

* * * * *